United States Patent
Kim et al.

(10) Patent No.: US 7,688,135 B2
(45) Date of Patent: Mar. 30, 2010

(54) N-WAY DOHERTY DISTRIBUTED POWER AMPLIFIER

(75) Inventors: Wan Jong Kim, Coquitlam (CA);
Kyoung Joon Cho, Coquitlam (CA);
Shawn Patrick Stapleton, Burnaby (CA); Jong Heon Kim, Yongsan-Gu (KR)

(73) Assignee: Dali Systems Co. Ltd., George Town, Grand Cayman (KY)

( * ) Notice: Subject to any disclaimer, the term of this patent is extended or adjusted under 35 U.S.C. 154(b) by 43 days.

(21) Appl. No.: 12/108,507

(22) Filed: Apr. 23, 2008

(65) Prior Publication Data
US 2008/0284509 A1  Nov. 20, 2008

Related U.S. Application Data

(60) Provisional application No. 60/925,577, filed on Apr. 23, 2007.

(51) Int. Cl.
*H03F 3/68* (2006.01)
(52) U.S. Cl. .................. 330/124 R; 330/295; 330/286
(58) Field of Classification Search ............ 330/295, 330/286, 124 R, 53–54, 84
See application file for complete search history.

(56) References Cited

U.S. PATENT DOCUMENTS

| | | | |
|---|---|---|---|
| 4,700,151 A | 10/1987 | Nagata | |
| 4,890,300 A | 12/1989 | Andrews | |
| 4,929,906 A | 5/1990 | Voyce et al. | |
| 5,049,832 A | 9/1991 | Cavers | |
| 5,121,412 A | 6/1992 | Borth | |
| 5,132,639 A | 7/1992 | Blauvelt et al. | |
| 5,396,190 A | 3/1995 | Murata | |
| 5,486,789 A | 1/1996 | Palandech et al. | |
| 5,579,342 A | 11/1996 | Crozier | |
| 5,675,287 A | 10/1997 | Baker et al. | |
| 5,732,333 A | 3/1998 | Cox et al. | |
| 5,936,464 A | 8/1999 | Grondahl | |
| 5,937,011 A | 8/1999 | Carney et al. | |
| 5,949,283 A | 9/1999 | Proctor et al. | |
| 5,959,499 A | 9/1999 | Khan et al. | |
| 5,963,549 A | 10/1999 | Perkins et al. | |
| 6,054,896 A | 4/2000 | Wright et al. | |
| 6,091,941 A | 7/2000 | Moriyama et al. | |
| 6,240,144 B1 | 5/2001 | Ha | |
| 6,242,979 B1 | 6/2001 | Li | |
| 6,246,865 B1 | 6/2001 | Lee | |
| 6,275,685 B1 | 8/2001 | Wessel et al. | |
| 6,512,417 B2 | 1/2003 | Booth et al. | |
| 6,552,634 B1 | 4/2003 | Raab | |

(Continued)

*Primary Examiner*—Robert Pascal
*Assistant Examiner*—Hieu P Nguyen
(74) *Attorney, Agent, or Firm*—James E. Eakin

(57) ABSTRACT

A power amplifier using N-way Doherty structure for extending the efficiency region over the high peak-to-average power ratio of the multiplexing modulated signals such as wideband code division multiple access and orthogonal frequency division multiplexing is disclosed. In an embodiment, the present invention uses a dual-feed distributed structure to an N-way Doherty amplifier to improve the isolation between at least one main amplifier and at least one peaking amplifier and, and also to improve both gain and efficiency performance at high output back-off power. Hybrid couplers can be used at either or both of the input and output. In at least some implementations, circuit space is also conserved due to the integration of amplification, power splitting and combining.

17 Claims, 5 Drawing Sheets

U.S. PATENT DOCUMENTS

| | | |
|---|---|---|
| 6,677,870 B2 | 1/2004 | Im et al. |
| 6,697,436 B1 | 2/2004 | Wright et al. |
| 6,703,897 B2 | 3/2004 | O'Flaherty et al. |
| 6,741,663 B1 | 5/2004 | Tapio et al. |
| 6,751,447 B1 | 6/2004 | Jin et al. |
| 6,963,242 B2 | 11/2005 | White et al. |
| 6,983,025 B2 | 1/2006 | Schell |
| 6,985,704 B2 | 1/2006 | Yang et al. |
| 7,035,345 B2 | 4/2006 | Jeckeln et al. |
| 7,042,287 B2 | 5/2006 | Robinson |
| 7,061,314 B2 | 6/2006 | Kwon et al. |
| 7,064,606 B2 | 6/2006 | Louis |
| 7,103,329 B1 | 9/2006 | Thon |
| 7,104,310 B2 | 9/2006 | Hunter |
| 7,109,792 B2 | 9/2006 | Leffel |
| 7,158,765 B2 | 1/2007 | Blair et al. |
| 7,193,472 B2 | 3/2007 | Gotou et al. |
| 7,248,642 B1 | 7/2007 | Vella-Coleiro |
| 7,259,630 B2 | 8/2007 | Bachman et al. |
| 7,321,635 B2 | 1/2008 | Ocenasek et al. |
| 7,321,636 B2 | 1/2008 | Harel et al. |
| 7,382,194 B2 * | 6/2008 | Apel .................... 330/295 |
| 7,469,491 B2 | 12/2008 | McCallister et al. |
| 2002/0080891 A1 | 6/2002 | Ahn et al. |
| 2002/0186783 A1 | 12/2002 | Opas et al. |
| 2002/0193085 A1 | 12/2002 | Mathe et al. |
| 2003/0095608 A1 | 5/2003 | Duperray |
| 2003/0179830 A1 | 9/2003 | Eidson et al. |
| 2004/0017859 A1 | 1/2004 | Sills et al. |
| 2004/0240585 A1 | 12/2004 | Bishop et al. |
| 2005/0079834 A1 | 4/2005 | Maniwa et al. |
| 2006/0097783 A1 * | 5/2006 | Okubo et al. ......... 330/124 R |
| 2007/0241812 A1 | 10/2007 | Yang et al. |
| 2008/0191801 A1 * | 8/2008 | Kim et al. .............. 330/124 R |
| 2009/0115512 A1 * | 5/2009 | Grondahl et al. ....... 330/124 R |

* cited by examiner

N-WAY DOHERTY DISTRIBUTED POWER AMPLIFIER

RELATED APPLICATION

This application claims the benefit of and incorporates by reference U.S. Provisional Patent Application Ser. No. 60/925,577 filed on Apr. 23, 2007.

BACKGROUND OF THE INVENTION

1. Field of the Invention

The present invention generally relates to high power communication systems. More specially, the present invention relates to high efficiency high power amplifiers for such systems.

2. The Prior Art

In modern digital wireless communication systems, such as IS-95, PCS, WCDMA, OFDM and so on, the power amplifiers have advanced towards having a wide bandwidth and large number of carriers. Recently, orthogonal frequency division multiplexing (OFDM) modulation is an attractive technique for transmitting information efficiently within a limited bandwidth like WiBRO and WiMAX. However, since the OFDM signal consists of a number of independently modulated sub-carriers, it produces a higher peak-to-average power ratio (PAR) signal. A typical PAR for a 64-subcarrier OFDM signal is around 8-13 dB. When the number of sub-carriers is increased to 2048, the PAR also increases, typically from 11 to 16 dB. The power amplifiers designed to operate with these high PARs typically have significantly deteriorated efficiency.

The Doherty amplifier is known as a technique for improving the efficiency at high output back-off power. Its primary advantage is the ease of configuration when applied to high power amplifiers, unlike other efficiency enhancement amplifiers or techniques such as switching mode amplifiers, EER, LINC and so on. Recent results have been reported on its use as: a symmetric Doherty structure, an asymmetric Doherty structure with uneven power transistors, and a N-way Doherty structure using multi-paralleled transistors. In the case of the symmetric Doherty amplifier, the maximum efficiency point is obtained at 6 dB back-off power.

The asymmetric Doherty amplifier can obtain a high efficiency at various back-off powers using a combination of different power device sizes for the main and peaking amplifiers. Unfortunately, it is difficult to optimize the gain and output power of the asymmetric Doherty amplifier because of the different device matching circuits and the delay mismatch between the main amplifier and the peaking amplifier.

The conventional N-way Doherty amplifier has an efficiency enhancement over a conventional 2-way Doherty structure by using multiple parallel transistors of identical devices. Its one drawback is that the total gain will be reduced due to the loss of the N-way input power splitter. Under low gain situations this will increase the power dissipation of the driving amplifier.

Further, while the conventional N-way Doherty amplifier can offer improved efficiency at high output back-off power, the performance of conventional N-way Doherty amplifiers deteriorates as to both gain and efficiency for higher peak-to-average power ratio (PAPR) signals.

Hence, a need remains in the arts for a method of applying both circuit-level and system-level techniques simultaneously for improving the gain and efficiency performance of N-way Doherty amplifier at high output back-off power in the high power communication systems.

SUMMARY OF INVENTION

Accordingly, the present invention has been made in view of the above problems, and it is an object of the present invention to provide a method for improving the gain and efficiency performance of the Doherty amplifying structure at high output back-off power for high power communication system applications. To achieve the above objects, according to the present invention, the technique employs dual-feed distributed amplifying. The power splitter and combiner of the conventional N-way Doherty amplifier are replaced by hybrid couplers with transmission lines. Compared to the conventional N-way Doherty amplifier, the present invention is able to achieve good isolation at the input and output as well as high gain performance with high efficiency.

BRIEF DESCRIPTION OF DRAWINGS

Further objects and advantages of the invention can be more fully understood from the following detailed description taken in conjunction with the accompanying drawings in which.

DETAILED DESCRIPTION OF THE INVENTION

In general, the present invention, involves the use of a single-ended dual-feed distributed (SEDFD) amplifying method with an N-way Doherty amplifier structure, so as to achieve high gain and high efficiency performances at high output back-off power. In some embodiments, the gain and efficiency performance is also maximized by adjusting the gate bias of N-way peaking amplifiers and shunt capacitors at the end of the half-wave length gate and drain lines, respectively. Compared to conventional N-way Doherty amplifiers, therefore, the present invention achieves higher power added efficiency (PAE) and higher gain for the multiplexing modulated signals. The method and apparatus provided by the present invention is therefore referred as an N-way Doherty Distributed Power Amplifier (NWDPA) hereafter.

Various embodiments of the NWDPA according to the present invention will now be described in detail with reference to the accompanying drawings.

Figure 1:
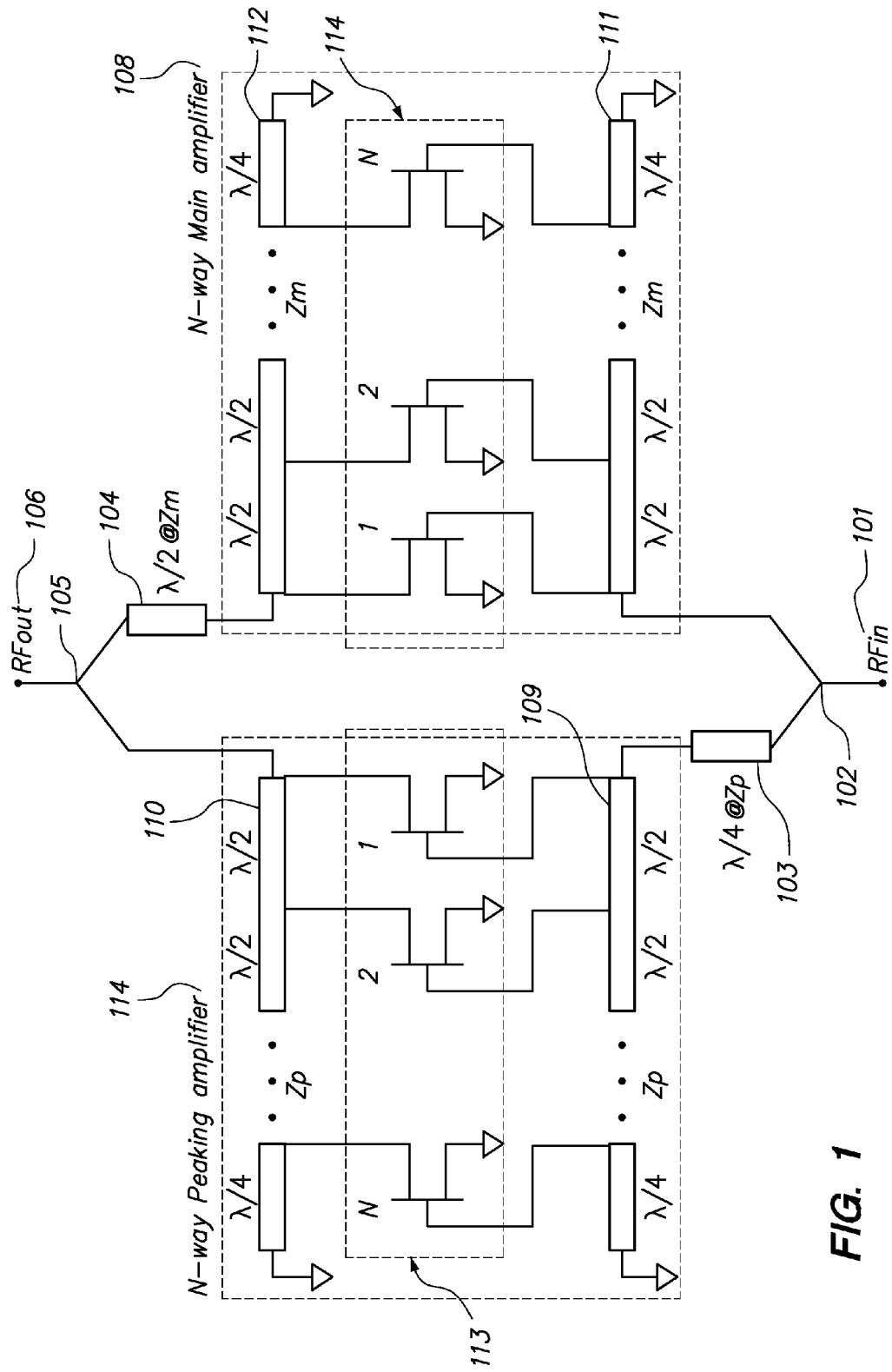
FIG. 1 is schematic diagram showing an embodiment of an N-way Doherty amplifier using a dual-feed distributed (DFD) method in accordance with the present invention.

FIG. 1 is a schematic diagram showing an N-way Doherty amplifier using the SEDFD method of the present invention. The RF input signal 101 is provided as an input to main SEDFD amplifier 108 and peaking SEFDF amplifier 107 by means of a power splitter. Each SEDFD amplifier consists of two transmission lines 109, 110, 111, 112 and N multiple transistors 113, 114. All transistors 113, 114 in the SEDFD main amplifier 107 and peaking amplifier 108 are connected by both gate and drain lines 109, 110, 111, 112 with a half-wave length at the center frequency and operate identically. The input signal of the SEDFD amplifier 107, 108 is distributed along the gate line 109, 111 and the amplified output signal is combined along the drain line 110, 112. Since each transistor adds power in phase to the signal, the SEDFD amplifier 107, 108 is able to provide higher gain. A λ/4 microstrip line 103 is prior to the SEDFD peaking amplifier 107 in order to synchronize the phases between the SEDFD main amplifier 108 and the SEDFD peaking amplifier 107. The output signal of the SEDFD main amplifier 108 is passed through a microstrip λ/4 impedance transformer 104 and combined with the output signal of the SEDFD peaking amplifier 107 by the power combiner 105.

Figure 2:
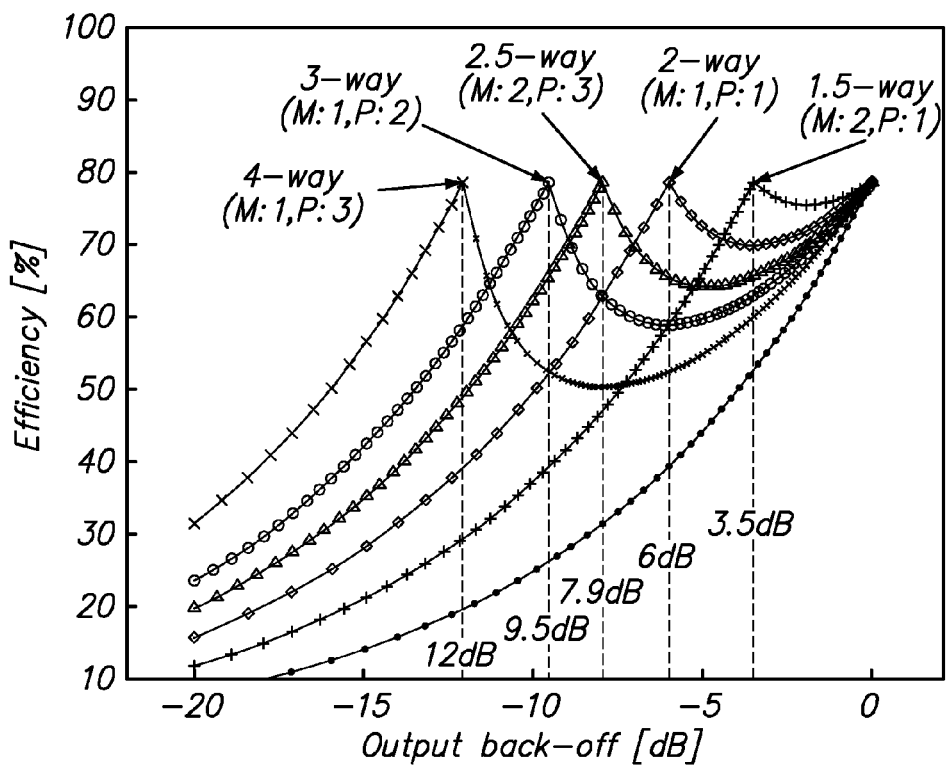
FIG. 2 is a graph showing efficiency characteristics of an N-way Doherty dual-feed distributed amplifier at various levels of output back-off power.

FIG. 2 is a graph showing efficiency characteristics of an NWDPA at various output back-off power. The efficiency of the NWDPA for the maximum power level is given by $$\eta = \frac{\pi}{4},$$

and the efficiency for the medium power level is given by $$\eta = \frac{\pi}{4} \cdot \frac{\left(\frac{P}{M}+1\right) \cdot \left(\frac{v_o}{v_{max}}\right)^2}{\left(\frac{P}{M}+2\right) \cdot \left(\frac{v_o}{v_{max}}\right) - 1}$$

where $v_o$ and $v_{max}$ are the output voltage and the maximum output voltage, respectively, M is the number of transistors for the main amplifier, and P the number of transistors for the peaking amplifier. Depending upon the embodiment, the main and peaking amplifiers can be either single transistors or multiple transistors, or other forms of amplifiers. In addition, the transistors can be discrete or integrated, again depending upon the embodiment.

For the low power level, the efficiency of the NWDPA is expressed as $$\eta = \frac{\pi}{4} \cdot \left(\frac{P}{M}+1\right) \cdot \frac{v_o}{v_{max}}.$$

The efficiency of the amplifier for various levels of output back-off power is calculated as a function of the number of the main and peaking amplifiers. The relationship between the extended back-off state $X_{BO}$ and the number of main and peaking amplifiers is given by $$X_{BO} = 20 \cdot \log_{10}\left(\frac{P}{M}+1\right).$$

Figure 3:
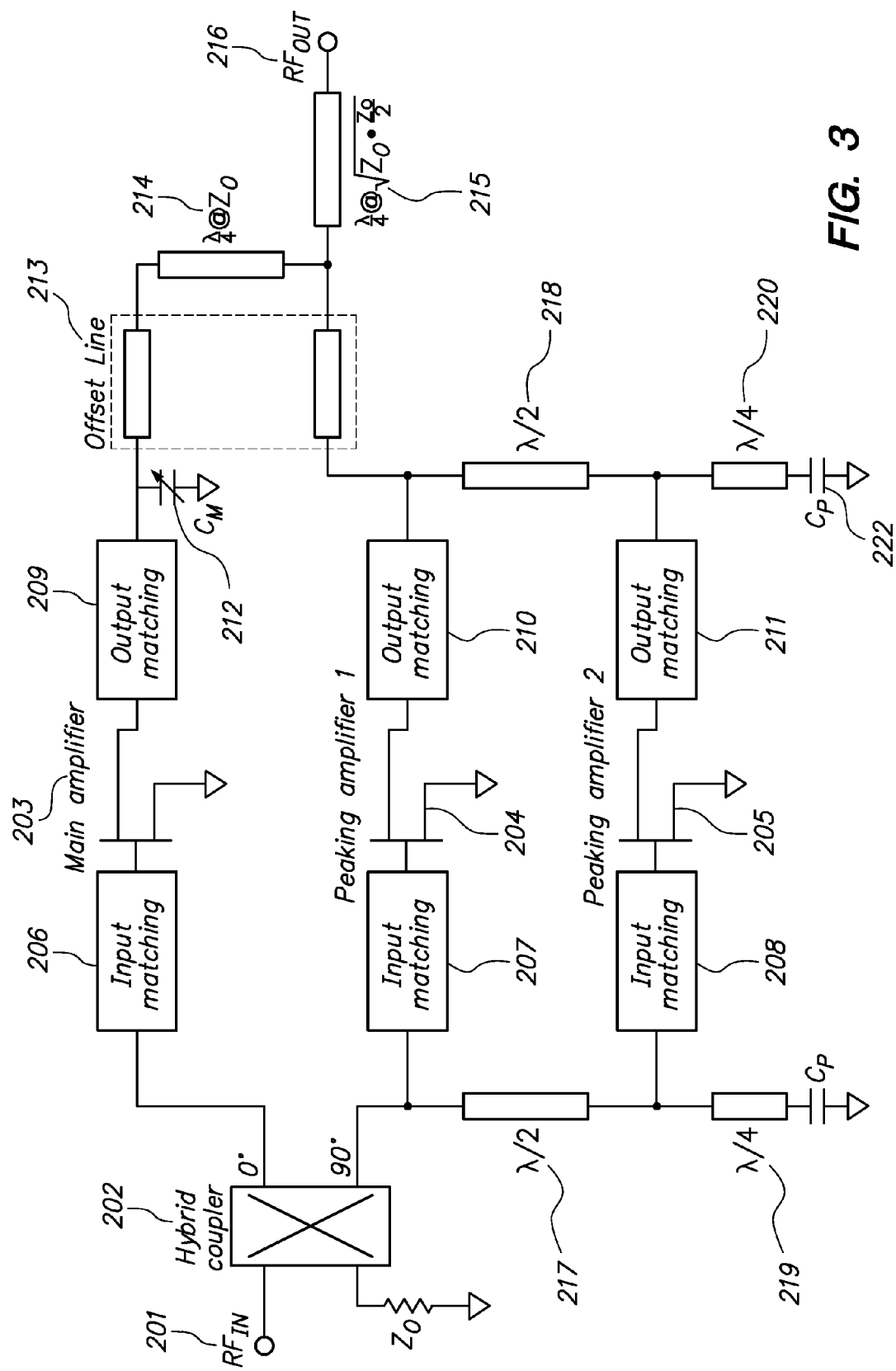
FIG. 3 is a schematic diagram showing an embodiment of a 3-way Doherty distributed amplifier in accordance with the present invention.

FIG. 3. is a schematic diagram showing an embodiment of a 3-way Doherty SEDFD amplifier of the present invention. In order to provide high efficiency at a back-off power of 9.5 dB, the amplifier consists of one main amplifier 203 and two peaking amplifiers 204, 205 using the same type of transistors. The RF input signal 201 is passed through a 90° hybrid coupler 202 and divided to a main amplifier 203 and two peaking amplifiers 204, 205. Input impedance matching circuits 206, 207, 208 are connected between the coupler and the main amplifier 203 and the peaking amplifiers 204, 205, respectively. In at least some embodiments, the main amplifier 203 is biased as a Class-AB amplifier and the peaking amplifiers 204, 205 biased as Class-C amplifiers. If the main amplifier is generally biased in Class AB mode, it will have a gain compression characteristic. In contrast, if the peaking amplifier is generally biased in Class C mode, it will have a gain expansion characteristic. In at least some embodiments, the present invention takes advantage of the complimentary characteristics, so that the gain compression of the Class AB main amplifier will be compensated by the gain expansion of the Class C peaking amplifiers to create a more linear power amplifier.

In order to achieve optimized power, output impedance matching circuits 209, 210, 211 are connected to the outputs of the main amplifier 203 and the peaking amplifiers 204, 205. A shunt capacitor $C_M$ 212 is connected to the output impedance matching circuit 209 of the main amplifier 203 so as to optimize the linearity of the NWDPA based on the linearity optimized Doherty amplifier method of U.S. provisional application No. 60/846,905 filed on November 2006, incorporated herein by reference. To obtain peak efficiency point at a desired output back-off power, compensation lines 213 are inserted between output impedance matching circuits 209, 210, 211 and λ/4 impedance transformers 214, 215. The peaking amplifiers 204, 205 are combined using the dual-feed distributed structure which has, in some embodiments, half-wave micro-strip lines 217, 218 at each gate and drain of the first peaking amplifier, shown as a FET for purposes of illustration and clarity. In FIG. 3, the peaking amplifier 1 is combined with the peaking amplifier 2 using a dual-feed distributed structure. The dual-feed distributed structure comprises the half wavelength and quarter wavelength lines and short-circuited quarter-wave length micro-strip lines 219, 220 at each gate and drain of the second peaking amplifier, respectively, connected through the associated input and output impedance matching circuits. The second peaking amplifier is shown in the illustrated embodiment as a single transistor for purposes of simplicity, but could be one or more transistors. The quarter wavelength transmission lines at the output could in some embodiments be replaced by a hybrid coupler.

The half-wave lines 217 and 218 are, in some embodiments, set at the center frequency of the operating power amplifier bandwidth. Shunt capacitors $C_p$ 221, 222 are connected in some embodiments to both ends of the short-circuited quarter-wave length micro-strip lines 219, 220 for optimizing both gain and efficiency characteristics of the NWDPA. Offset line 213 can be included to prevent leakage power between the main amplifier 203 and the peaking amplifiers 204, 205. In some embodiments, the hybrid coupler 202 will cause some gain compression, and this can be compensated by the gain expansion of the peaking amplifiers. An additional hybrid coupler can be connected at the output in some embodiments. Further, those skilled in the art will appreciate that the main distributed amplifiers and peaking distributed amplifiers can be constructed either as separate miniature microwave integrated circuits or on one integrated MMIC.

In examining the performance of NWDPA, a 42 dBm high power amplifier is designed and implemented by using LDMOS FET's with p1 dB of 150 W.

Figure 4:
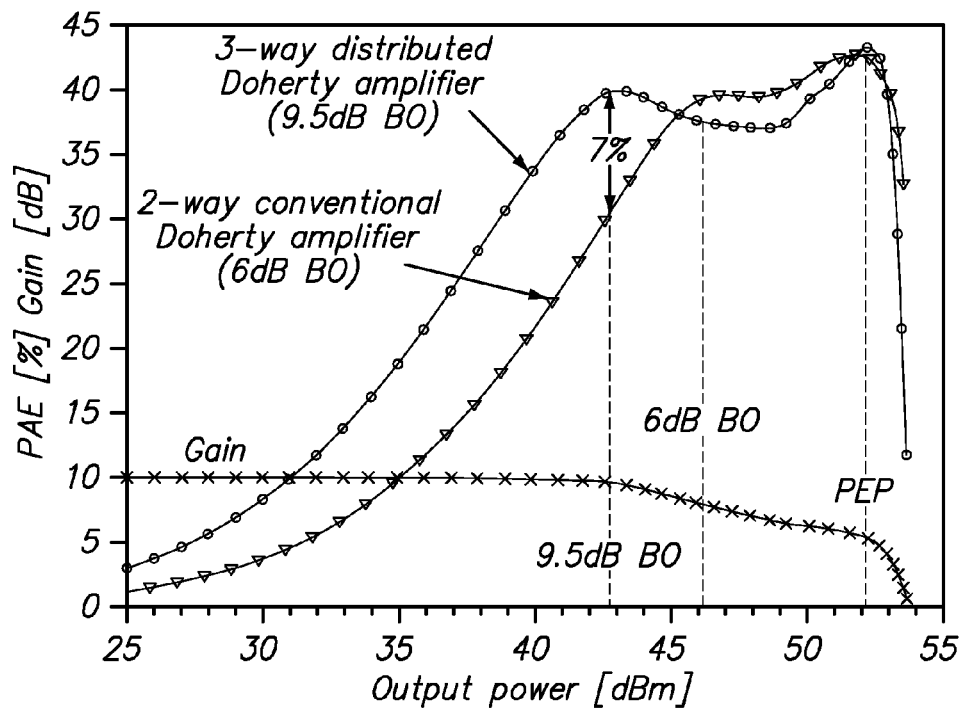
FIG. 4 is a graph showing simulation results of gain and power added efficiency performance (PAE) of an embodiment of a 3-way Doherty distributed amplifier in accordance with the present invention.

FIG. 4 is a graph showing simulation results of gain and PAE for a single tone signal at the frequency of 2140 MHz using a 3-way Doherty distributed amplifier such as shown in FIG. 3. The operating point of the Class AB biased main amplifier is: $I_{DQ}$=510 mA, $V_{GS}$=3.82 V and $V_{DS}$=27 V. The operating points of the Class C biased peaking amplifiers are: 1) Peaking amplifier 1; $I_{DQ}$=0 mA, $V_{GS}$=2.4 V and $V_{DS}$=27 V, 2) Peaking amplifier 2; $I_{DQ}$=0 mA, $V_{GS}$=2.6 V and $V_{DS}$=27 V. The output impedance of the combined peaking amplifier using a dual-feed distributed structure is 4.65+j2.1Ω. An offset line of approximately 0.25λ was inserted; this corresponds to an optimum output resistance of 521Ω. From the simulated results, 43% PAE was obtained at a peak envelope power (PEP) of around 200 W. Consequently, a 40% PAE at 9.5 dB back-off power from the peak efficiency point was achieved. This was an efficiency improvement of approximately 7% in comparison to that of the 2-way conventional Doherty amplifier at a 6 dB peaking point, also shown in FIG. 4. A gain of approximately 10.5 dB was obtained from 2130 to 2150 MHz.

Figure 5:
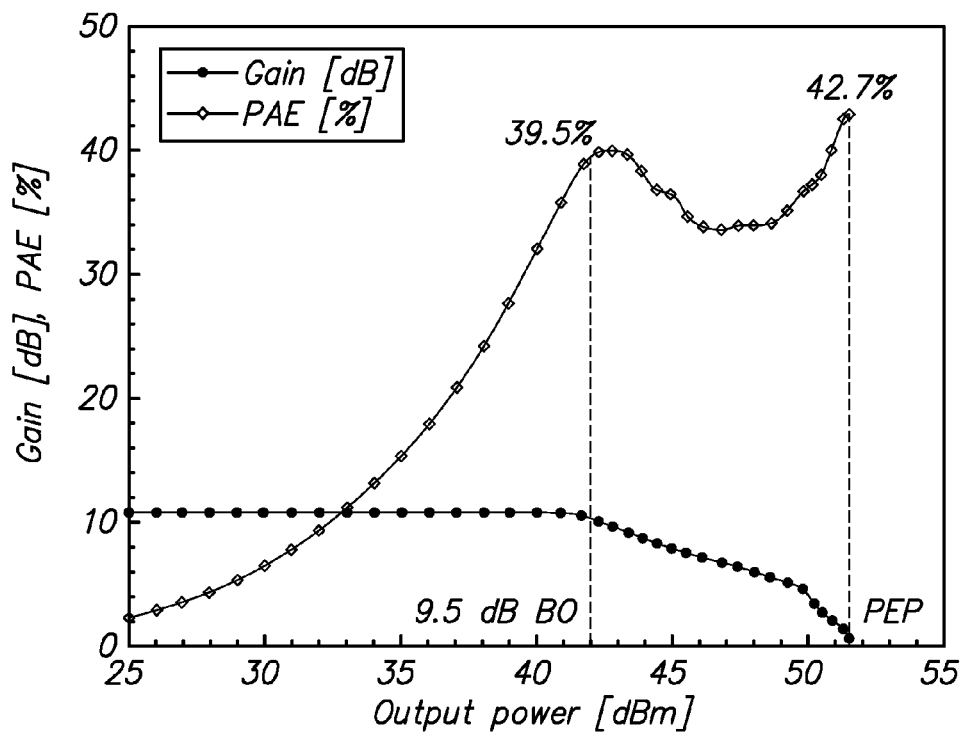
FIG. 5 is a graph showing measurement results of gain and power added efficiency performance (PAE) of an embodiment of a 3-way Doherty distributed amplifier in accordance with the present invention.

FIG. 5 is a graph showing measurement results of gain and PAE of the 3-way Doherty distributed amplifier of the present invention. The main amplifier's operating point is: $I_{DQ}$=480 mA, $V_{GS}$=3.9 V. The operating points of the peaking amplifiers are: 1) Peaking amplifier 1; $I_{DQ}$=0 mA, $V_{GS}$=2.1 V; 2) Peaking amplifier 2; $I_{DQ}$=0 mA, $V_{GS}$=1.9 V. The shunt capacitors, $C_P$ and $C_M$, of 15 pF and 0.5 pF are used, respectively. A 42.7% PAE at PEP of 131 W and 39.5% PAE at 9.5 dB back off are achieved, respectively. A gain of approximately 11 dB was obtained at 9.5 dB back off.

Figure 6:
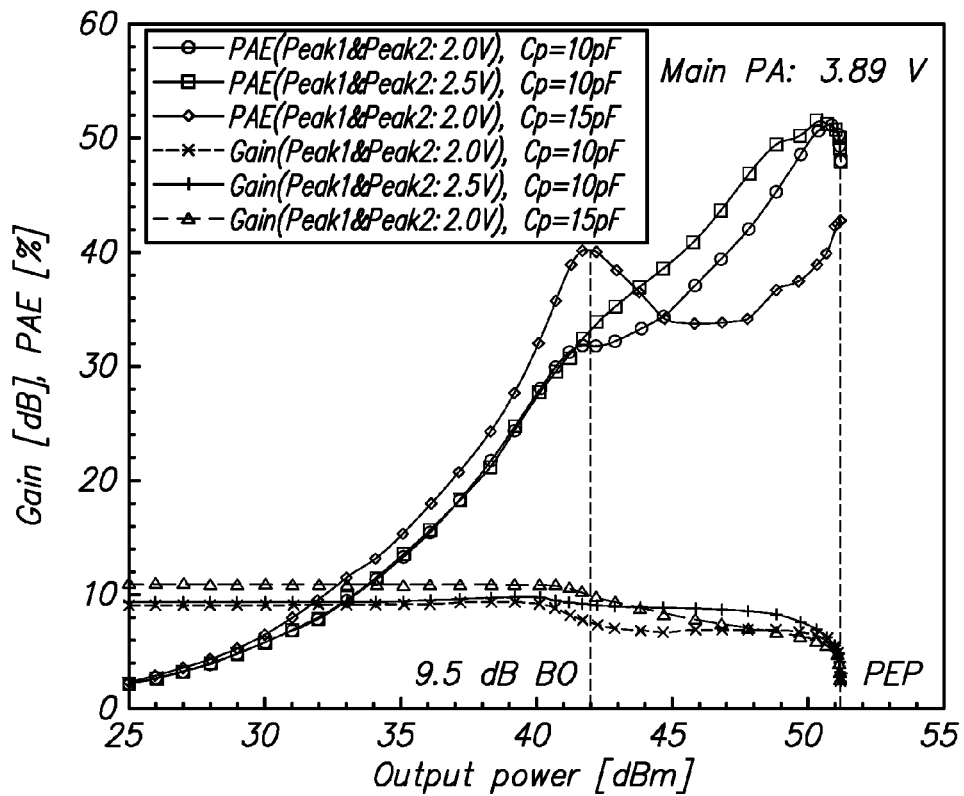
FIG. 6 is a graph showing measurement results of gain and PAE performance variation as a function of the shunt capacitor and bias voltage of peaking amplifiers for a single-tone signal using an embodiment of a 3-way Doherty distributed amplifier in accordance with the present invention.

FIG. 6 is a graph showing measurement results of gain and PAE performance variation as a function of the shunt capacitor and bias voltage of peaking amplifiers for single-tone signal using the 3-way Doherty distributed amplifier of the present invention. Optimization of $C_p$ and the bias point of the two-peaking amplifiers produced efficiency and gain improvement of approximately 8% and 2 dB at 9.5 dB back off, even though the PAE is reduced at PEP.

Figure 7:
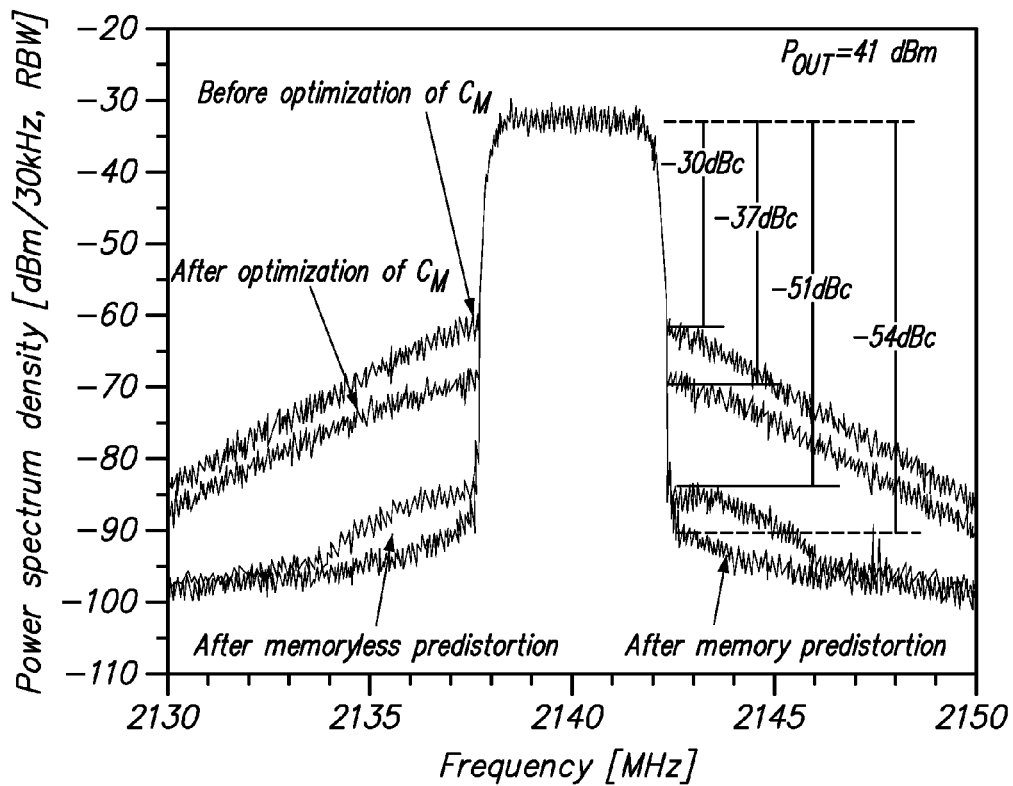
FIG. 7 is a graph showing measurement results of spectrum for a single WCDMA carrier using the 3-way Doherty distributed amplifier of the present invention.

FIG. 7 is a graph showing measurement results of spectrum for a single WCDMA carrier using a 3-way Doherty distributed amplifier in accordance with the present invention. The operating points were $V_{GS}$=3.79 V (Main PA), $V_{GS}$=3.1 V (Peaking PA1) and $V_{GS}$=2.5V (Peaking PA2), respectively. The shunt capacitors, $C_P$ and $C_M$, of 9.1 pF and 0.5 pF were used, respectively. In order to achieve high linearity, both memoryless and memory-based digital predistortion were applied. The ACLR performances of −51 dBc after memoryless and −54 dBc after memory compensation were obtained at 41 dBm output power and +2.5 MHz offset frequency.

Figure 8:
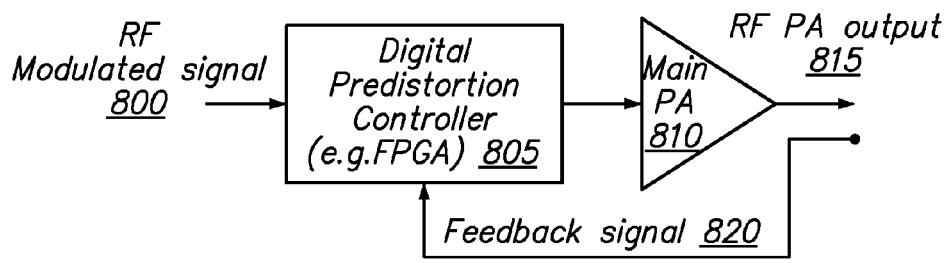
FIG. 8 shows a hybrid mode power amplifier system in accordance with the invention.

In summary, the NWDPA of the present invention, compared to the conventional N-way Doherty amplifier, improves the gain performance more effectively since the NWDPA uses a SEDFD structure in conjunction with a Doherty amplifier. A hybrid mode power amplifier system in accordance with the invention is shown in FIG. 8, in which a modulated RF input signal 800 is provided to a digital predistortion controller 805, which in turn provides its output to a power amplifier 810 in accordance with the present invention. The RF output 815 is monitored, and a signal representative of the output is fed back to the controller 805 as a feedback signal 820.

Although the present invention has been described with reference to the preferred embodiments, it will be understood that the invention is not limited to the details described thereof. Various substitutions and modifications are disclosed in the foregoing description, and others will be apparent to those of ordinary skill in the art based on the teachings herein. Therefore, all such substitutions and modifications are intended to be embraced within the scope of the invention as defined in the appended claims.

What is claimed is:

1. An N-way Doherty distributed amplifier comprising:
   an RF input,
   at least one main distributed amplifier,
   at least two peaking distributed amplifiers,
   hybrid coupler responsive to an input signal for providing input to the at least one main distributed amplifier and the at least two peaking distributed amplifiers, respectively, and
   phase synchronizer responsive to the RF input for synchronizing the phase between the at least one main distributed amplifier and the at least two peaking distributed amplifiers.

2. The N-way Doherty distributed amplifier of claim 1 wherein the RF input is single-ended dual-feed.

3. The N-way Doherty distributed amplifier of claim 1 wherein all transistors in the at least one main distributed amplifier and the at least two peaking distributed amplifiers operate substantially identically.

4. The N-way Doherty distributed amplifier of claim 1 wherein gain compression of the at least one main distributed amplifier is compensated by gain expansion of the at least two peaking distributed amplifiers.

5. The N-way Doherty distributed amplifier of claim 1 further comprising shunt capacitors operatively connected to the at least one main distributed amplifier and the at least two peaking distributed amplifiers, and wherein phase of the main and peaking distributed amplifiers is controlled by the capacitance of the shunt capacitors.

6. The N-way Doherty distributed amplifier of claim 1 wherein efficiency of the amplifier at various output back-off power is determined as a function of the number of the main and peaking amplifiers given by the following equation:

$$\eta = \frac{\pi}{4} \cdot \left(\frac{P}{M} + 1\right) \cdot \frac{v_o}{v_{max}}$$

wherein $v_o$ and $v_{max}$ are the output voltage and the maximum output voltage, respectively, M is the number of transistor for the main amplifier, and P the number of transistors for the peaking amplifier.

7. A N-way Doherty distributed amplifier of claim 1 wherein an extended back-off state $X_{BO}$ is described by the following equation:

$$X_{BO} = 20 \cdot \log_{10}\left(\frac{P}{M} + 1\right).$$

8. The N-way Doherty distributed amplifier of claim 1 wherein the N-way Doherty distributed amplifier configured as a main amplifier of a feed-forward linearization technique.

9. The N-way Doherty distributed amplifier of claim 1 wherein the N-way Doherty distributed amplifier receives an input from a digital pre-distorter.

10. The N-way Doherty distributed amplifier of claim 1 wherein the main distributed amplifiers and peaking distributed amplifiers one of a group comprising, first, separate miniature microwave integrated circuits and, second, one integrated MMIC.

11. The N-way Doherty distributed amplifier of claim 1 wherein the phase synchronizer delays the phase of the peaking amplifier later than the phase of the main amplifier by approximately 90°.

12. The N-way Doherty distributed amplifier of claim 1 wherein the phase synchronizer comprises a $\lambda/4$ microstrip line prior to the peaking amplifiers to synchronize the phases between the main distributed amplifiers and the peaking distributed amplifiers.

13. The N-way Doherty distributed amplifier of claim 1 further comprising input impedance matching circuits connected to front ends of the main distributed amplifiers and the peaking distributed amplifiers, respectively.

14. The N-way Doherty distributed amplifier of claim 1 further comprising gate and drain lines connected to the at least one main distributed amplifier and the at least two peaking distributed amplifiers, the gate and drain lines having a half-wave length at the center frequency of the power amplifier.

15. The N-way Doherty distributed amplifier of claim 1 further comprising output impedance matching circuits connected to at least one output of the at least one main distributed amplifier and the at least two peaking distributed amplifier.

16. The N-way Doherty distributed amplifier of claim 1 further comprising at least one offset line inserted between ends of the output impedance matching circuits for the main distributed amplifiers and the peaking distributed amplifiers to prevent leakage of power from the main distributed amplifier to the peaking distributed amplifier.

17. The N-way Doherty distributed amplifier of claim 1 further comprising a $\lambda/4$ impedance transformer for characteristic impedance $Z_0$ connected to the offset lines.

* * * * *